(12) United States Patent
Tabota

(10) Patent No.: US 6,490,926 B2
(45) Date of Patent: *Dec. 10, 2002

(54) ACCELERATION SENSOR MODULE

(75) Inventor: Jun Tabota, Toyama-ken (JP)

(73) Assignee: Murata Manufacturing Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/440,907

(22) Filed: Nov. 16, 1999

(65) Prior Publication Data

US 2002/0011109 A1 Jan. 31, 2002

(30) Foreign Application Priority Data

Nov. 25, 1998 (JP) .............................. 10-333519

(51) Int. Cl.[7] .............................................. G01P 15/09
(52) U.S. Cl. ..................... 73/514.34; 73/493; 73/497; 310/319
(58) Field of Search ............................. 73/1.38, 514.33, 73/493, 431, 514.29, 514.34, 497; 310/319, 329, 331

(56) References Cited

U.S. PATENT DOCUMENTS

| | | | | |
|---|---|---|---|---|
| 3,899,695 A | * | 8/1975 | Solomon et al. | 307/308 |
| 5,233,871 A | * | 8/1993 | Schwarz et al. | 73/493 |
| 5,295,387 A | * | 3/1994 | Buie et al. | 73/1.38 |
| 5,621,157 A | * | 4/1997 | Zhao et al. | 73/1.38 |

FOREIGN PATENT DOCUMENTS

| | | | |
|---|---|---|---|
| JP | 62-190748 | * | 8/1987 |
| JP | 5-93736 | | 4/1993 |
| JP | 7-198744 | * | 8/1995 |
| JP | 10-170544 | * | 6/1998 |
| JP | 10-281907 | * | 10/1998 |

* cited by examiner

Primary Examiner—Helen Kwok
(74) Attorney, Agent, or Firm—Ostrolenk, Faber, Gerb & Soffen, LLP

(57) ABSTRACT

An acceleration sensor module capable of performing sensitivity adjustment in a minimum arrangement without containing an amplifier includes an acceleration sensor and a trimmable resistor which are mounted on a printed wiring board. At least one terminal of the acceleration sensor and at least one terminal of the trimmable resistor are connected to at least one external connection terminal of the printed circuit board through printed wiring.

20 Claims, 4 Drawing Sheets

ACCELERATION SENSOR MODULE

BACKGROUND OF THE INVENTION

1. Field of the Invention

The present invention relates to an acceleration sensor module capable of performing sensitivity adjustment.

2. Description of the Related Art

Conventionally, as an acceleration sensor using piezoelectric ceramics, for example, the sensor described in Japanese Patent No. 2780594 has been known. Since such a sensor does not have an adjustment method for adjusting an individual sensor to a targeted sensitivity (voltage output in the case of applying a specified acceleration) or has difficulty in adjusting an individual sensor to a targeted sensitivity, it has a sensitivity tolerance between approximately ±5 and ±15% due to variations in manufacturing and materials.

However, a high-performance sensor having a sensitivity tolerance of less than ±5%, such as an acceleration sensor used in servo control of an MR-head for a Hard Disc Drive, is sometimes required. An ordinary procedure to meet the demand is to adjust the gain of an amplifier connected to the subsequent stage of the sensor. Consequently, in order to provide a sensor adjusted with high precision, a module having an amplifier therein is provided even if it is not necessary for the acceleration sensor characteristics itself, and the sensor is put into commercial production after adjustment of the gain is performed. As a result, this leads not only to increase in the size of the module, but also to an increase in cost.

SUMMARY OF THE INVENTION

Accordingly, it is an object of the present invention to provide an acceleration sensor module capable of performing sensitivity adjustment in a minimum arrangement without containing an amplifier.

In order to solve the above problems, an acceleration sensor module of the present invention includes a printed wiring board, and an acceleration sensor and a trimmable resistor, which are disposed on the printed wiring board, in which at least one terminal of the acceleration sensor and at least one terminal of the trimmable resistor are respectively connected via printed wiring to at least one external connection terminal on the printed wiring board to be connected to an external circuit.

The acceleration sensor and the trimmable resistor are mounted on the printed wiring board, and the terminal of the acceleration sensor and the terminal of the trimmable resistor are respectively separately connected to the external connection terminal disposed on the printed wiring board through the printed wiring. One of the terminals of the acceleration sensor and one of the terminals of the trimmable resistor may be connected to the external connection terminal by making a common connection in the circuit.

The resistance value of the trimmable resistor is adjusted by laser trimming or the like so as to adjust the sensitivity of the acceleration sensor, so that variations in the sensitivity can be held within a targeted tolerance. Since additional components such as an amplifier are not mounted on the printed wiring board on which the acceleration sensor and the trimmable resistor are mounted, miniaturization can be achieved, and moreover, significantly low-cost manufacturing is possible.

Although the trimmable resistor may be, for example, an individual component which is mounted on the printed wiring board by soldering or the like, it may also be a film-formed resistor, that is, a resistor film which is formed on or within the printed wiring board directly by a printing method or the like. In short, any type of resistor is usable as long as the adjustment of resistance values can be performed by laser trimming or the like.

As an acceleration sensor, a sensor using a semiconductor may be employed. According to an aspect of the present invention, it is preferable to use a piezoelectric acceleration sensor, wherein a piezoelectric ceramic element converts an acceleration into electrical signals and detects the acceleration. In this case, since a chip type of sensor can be formed, this contributes to miniaturization of the module.

According to another aspect of the present invention, it is preferable to connect a temperature compensation capacitor in parallel to the acceleration sensor in the vicinity of the acceleration sensor on the printed wiring board. The output voltage of the piezoelectric ceramic element is influenced by the ambient temperature in the piezoelectric acceleration sensor. However, it is possible to obtain an output voltage of the acceleration sensor which is hardly subjected to the influence of the ambient temperature by connecting a capacitor having appropriate capacitance and temperature characteristics in parallel with the acceleration sensor and in the vicinity of a place on the printed wiring board where the temperature is substantially the same as that of the acceleration sensor.

Other features and advantages of the present invention will become apparent from the following description of the invention which refers to the accompanying drawings.

BRIEF DESCRIPTION OF THE DRAWING(S)

DETAILED DESCRIPTION OF EMBODIMENTS OF THE INVENTION

Figure 1:
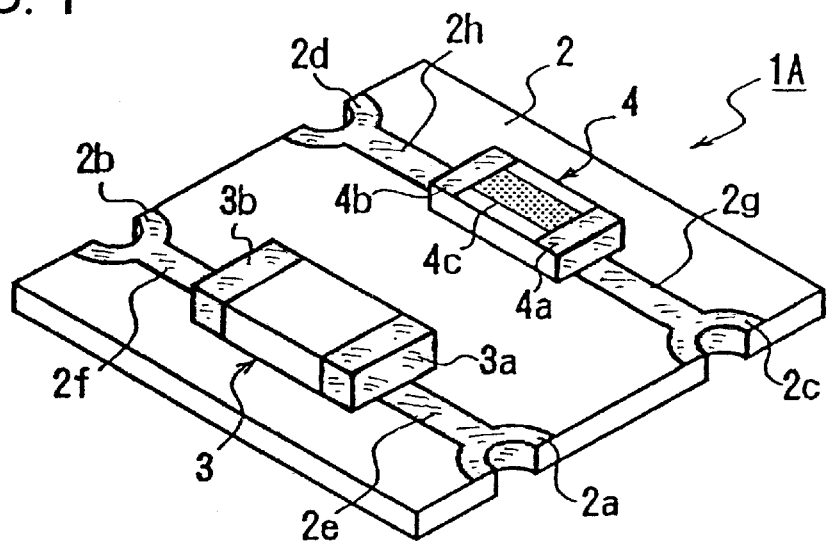
FIG. 1 is a perspective view of a first embodiment of an acceleration sensor module according to the present invention.

FIG. 1 shows a first embodiment of an acceleration sensor module according to the present invention. This module 1A is constituted as a surface-mounted type, which includes a small printed wiring board 2 having an acceleration sensor 3 and a trimmable resistor 4 mounted thereon. The printed wiring board 2 includes a rectangular insulating resin substrate or a ceramic substrate, with four independent external connection terminal electrodes 2a through 2d to be connected to an external circuit being formed on the opposing two sides, and four independent printed wires 2e through 2h connected to the respective terminal electrodes 2a through 2d being formed on the surface. The external connection terminal electrodes 2a through 2d are formed in such a manner that they extend to the other side of the board via through-hole grooves formed on the side edges of the printed wiring board 2.

Preferably, the acceleration sensor 3 is a piezoelectric acceleration sensor for detecting an acceleration by converting it into electrical signals by using a piezoelectric ceramic element which has electrodes 3a and 3b formed on both edges thereof which are fixed and connected to the printed wiring 2e and 2f by soldering or the like. As a piezoelectric acceleration sensor, it is possible to use a chip type of sensor, which is described, for example, in Japanese Patent No. 2780594, Japanese Unexamined Patent Application Publication No. 6-324073, Japanese Unexamined Patent Application Publication No. 7-20144, Japanese Unexamined Patent Application Publication No. 7-27784, Japanese Unexamined Patent Application Publication No. 8-75774, Japanese Unexamined Patent Application Publication No. 8-166401, Japanese Unexamined Patent Application Publication No. 9-61450, Japanese Unexamined Patent Application Publication No. 9-26433, and Japanese Unexamined Patent Application Publication No. 10-62445.

The trimmable resistor 4, as publicly known, includes electrodes 4a and 4b formed on both edges of a substrate. A resistor 4c for trimming is provided between the electrodes 4a and 4b, in which the electrodes 4a and 4b are fixed and connected to the printed wires 2g and 2h, respectively, by soldering or the like. The resistor 4c may be trimmed by radiation of a laser beam onto the resistor 4c. This permits a part of the resistor 4c to be eliminated, leading to an increase in the resistance value.

Figure 2:
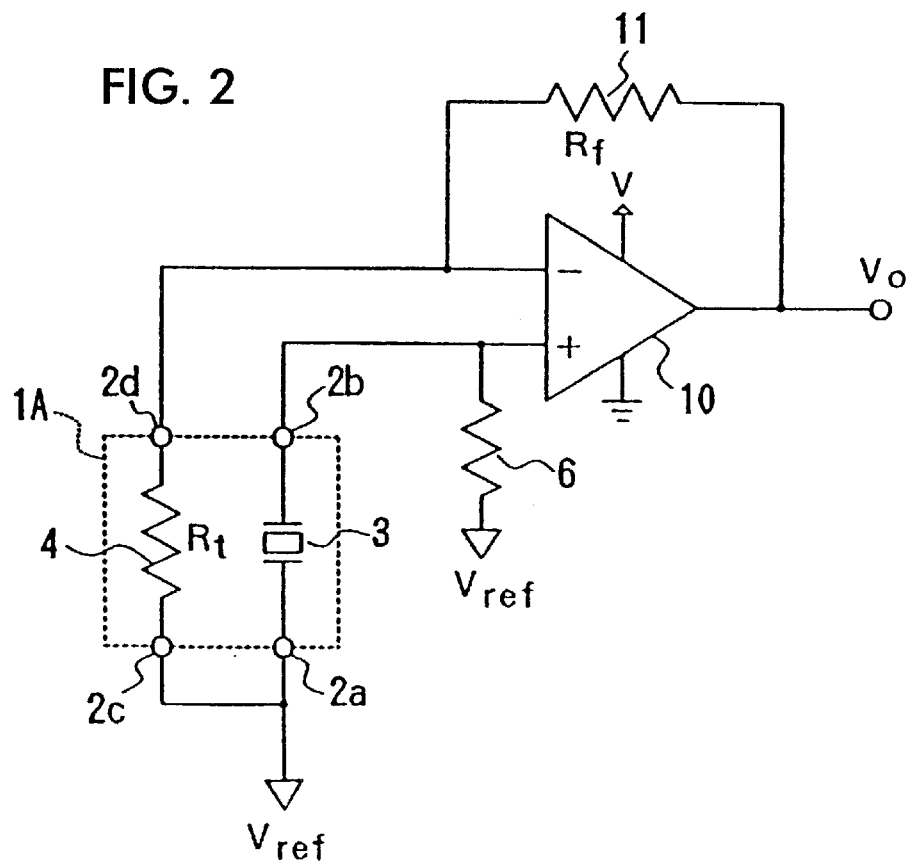
FIG. 2 is a circuit diagram of an example of an acceleration sensing device incorporating the acceleration sensor module shown in FIG. 1.

FIG. 2 shows a circuit diagram of an example of an acceleration sensing device using the acceleration sensor module 1A shown in FIG. 1. The module 1A is mounted on another printed wiring board (not shown). In addition to a non-inversion amplifier 10 and a feedback resistor 11 of the non-inversion amplifier 10, a leak resistor 6, and devices (not shown) to be controlled by acceleration (for example, an HDD device, an air bag control device, etc.) are mounted on the printed wiring board. The terminal electrodes 2b and 2d of the module 1A are connected respectively in such a manner that an end of the acceleration sensor 3 is connected to the positive input of the non-inversion amplifier 10 and an end of the trimmable resistor 4 (having a value $R_f$) is connected to the inversion input of the same. A feedback resistor 11, having a value of $R_t$, is connected between the output of the amplifier and the inverting input thereof. A common voltage, $V_{ref}$, is applied to the terminal electrodes 2a and 2c of the module 1A and to the leak resistor 6.

Although FIG. 2 adopts the non-inversion amplifier 10 using a single power source, it may be possible to adopt a non-inversion amplifier using dual power sources.

Next, a description will be given of a method for adjusting the sensitivity of the acceleration sensing device. The gain A of the non-inversion amplifier 10 is given as follows:

$$A = \frac{R_f + R_t}{R_t} \qquad \text{[Equation 1]}$$

When the output sensitivity with respect to the acceleration of the acceleration sensor 3 is represented by $S_G$ (V/G), the output $V_O$ of the amplifier 10 with respect to an acceleration g (G) is as follows:

$$Vo = \frac{R_f + R_t}{R_t} S_G \cdot g \qquad \text{[Equation 2]}$$

Now, adjusting sensitivity $V_O/g$ of the entire structure of the acceleration sensor including the amplifier 10 to a targeted value with high precision is considered. First, an appropriate resistance value Rf (for example, 100 kΩ) of the feedback resistor 11 is determined in advance. A circuit jig for adjustment which is used before the sensor is actually mounted on the circuit board, including a resistor, having the value Rf, an operational amplifier, a voltage divider for supplying necessary voltage $V_{ref}$ and the like, is prepared. An assumption is made that the sensitivity $S_G$ of the sensor as an individual device has a tolerance of 1 mV/G±10% (0.9 to 1.1 mV/G). An initial value of the resistance value Rt of the trimmable resistor 4 is, for example, set to 8 kΩ. When a target value of the gain of the entire structure including the amplifier is set to 10 mV/G±1%, the entire sensitivity is indicated as follows:

$$\frac{Vo}{g} = \frac{100k + 8k}{8k} \times (0.9 \sim 1.1) \qquad \text{[Equation 3]}$$
$$= 12.15 \sim 14.85$$

Next, Rt is adjusted to make $V_O/g$ achieve a target value 10 mV/G by using a laser trimmer or the like, while a predetermined acceleration is applied to the module 1A disposed in the adjustment circuit jig.

When an amplifier 10 having the same configuration as above is mounted on a substrate to be used actually, and the adjusted module 1A as described above is used, an acceleration sensor device adjusted with high precision overall can be obtained. Regarding the resistor 11 (Rf) in the circuit to be used actually, it is clear that a resistor having sufficient precision is employed, for example, precision of ±0.5% with respect to a required precision. In addition, since the gain of the amplifier 10 is determined only by resistance, the operational amplifier used in the adjustment circuit jig and the non-inversion amplifier 10 actually used are not necessarily the same.

Figure 3:
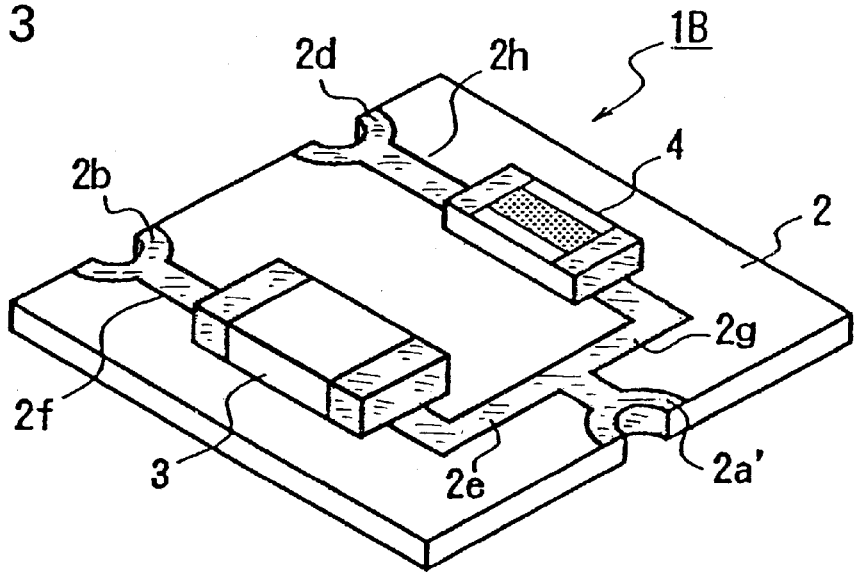
FIG. 3 is a perspective view of a second embodiment of the acceleration sensor module according to the present invention.

FIG. 3 shows a second embodiment as an acceleration sensor module 1B. In FIG. 1, the four independent external connection terminal electrodes 2a to 2d are formed on the module 1A. However, in FIG. 3, the two external connection terminal electrodes 2a and 2c on one end side are integrated for common use to form a terminal electrode 2a', and an electrode of the acceleration sensor 3 and an electrode of the trimmable resistor 4 are connected in common to the terminal electrode 2a' integrated for common use, via printed wires 2e and 2g.

Figure 4:
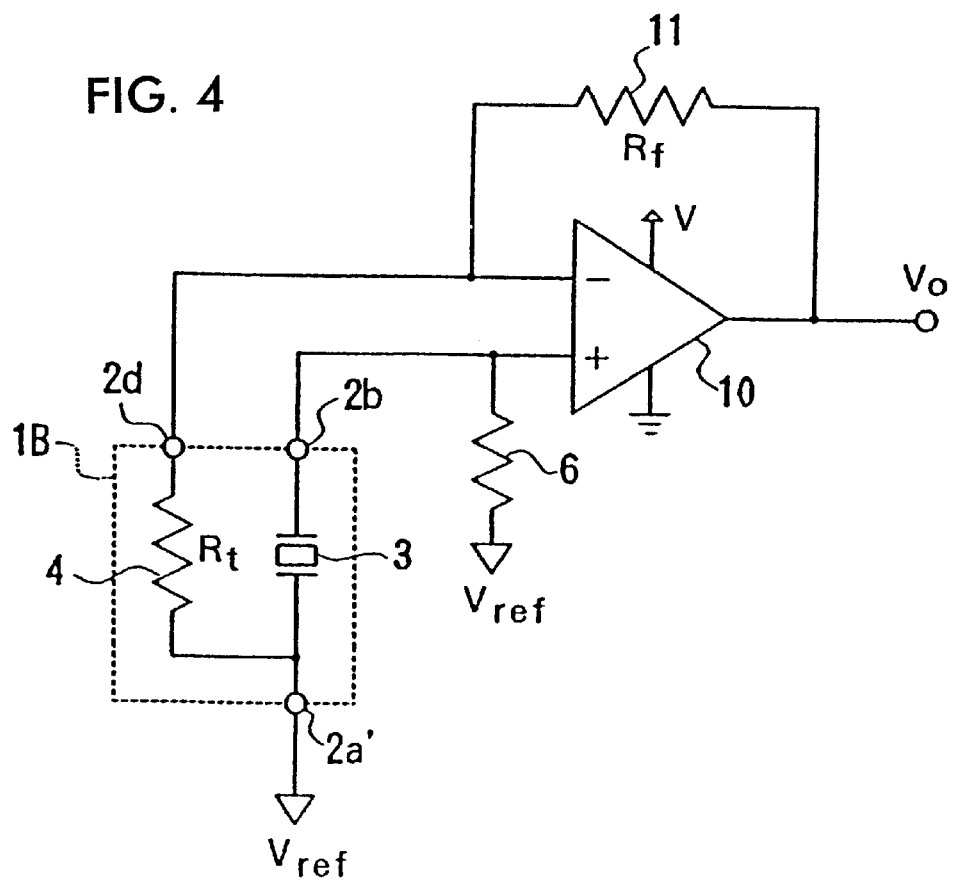
FIG. 4 is a circuit diagram of an example of an acceleration sensing device incorporating the acceleration sensor module shown in FIG. 3.

FIG. 4 shows an example of a circuit diagram of an acceleration sensing device incorporating the acceleration sensor module 1B shown in FIG. 3. Since the structure of each section is the same as that in FIG. 2 except for the terminal electrode 2a', the explanation is omitted.

Figure 5:
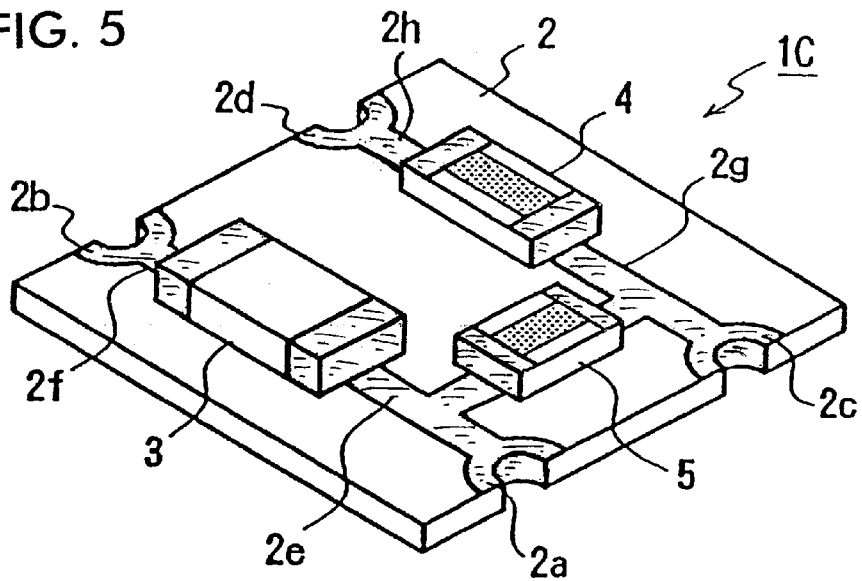
FIG. 5 is a perspective view of a third embodiment of the acceleration sensor module according to the present invention.

FIG. 5 shows a third embodiment as an acceleration sensor module 1C. In this embodiment, another resistor 5, which is different from the trimmable resistor 4, is connected between the printed wires 2e and 2g formed on the printed wiring board 2. One of the two resistors 4 and 5 or both of them can be trimmable resistors. Since the other structure is the same as that in the first embodiment (FIG. 1), the same reference numerals are given to the same parts and the explanation is omitted.

Figure 6:
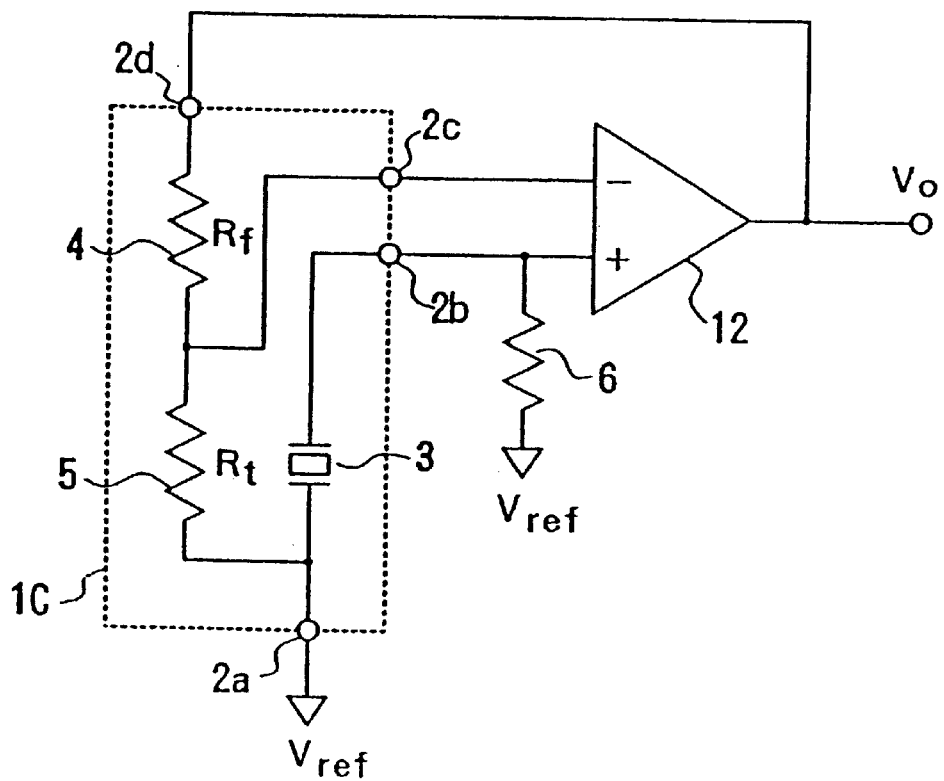
FIG. 6 is a circuit diagram of an example of an acceleration sensing device incorporating the acceleration sensor module shown in FIG. 5.

FIG. 6 shows an example of a circuit diagram of an acceleration sensing device incorporating the acceleration sensor module 1C shown in FIG. 5. The voltage $V_{ref}$ is applied to the terminal electrode 2a of the module 1C; the terminal electrode 2b is connected to the positive input of the operational amplifier 12; the terminal electrode 2c is connected to the inversion input of an operational amplifier 12, whereas the terminal electrode 2d is connected to the output of the operational amplifier 12. In this case, the module 1C contains the resistor 4, which is a feedback resistor of the operational amplifier 12, so that gain adjustment of the operational amplifier 12 can be freely performed by using either one of the resistors 4 and 5 or both of them as a trimmable resistor, leading to facilitation of the sensitivity adjustment.

Figure 7:
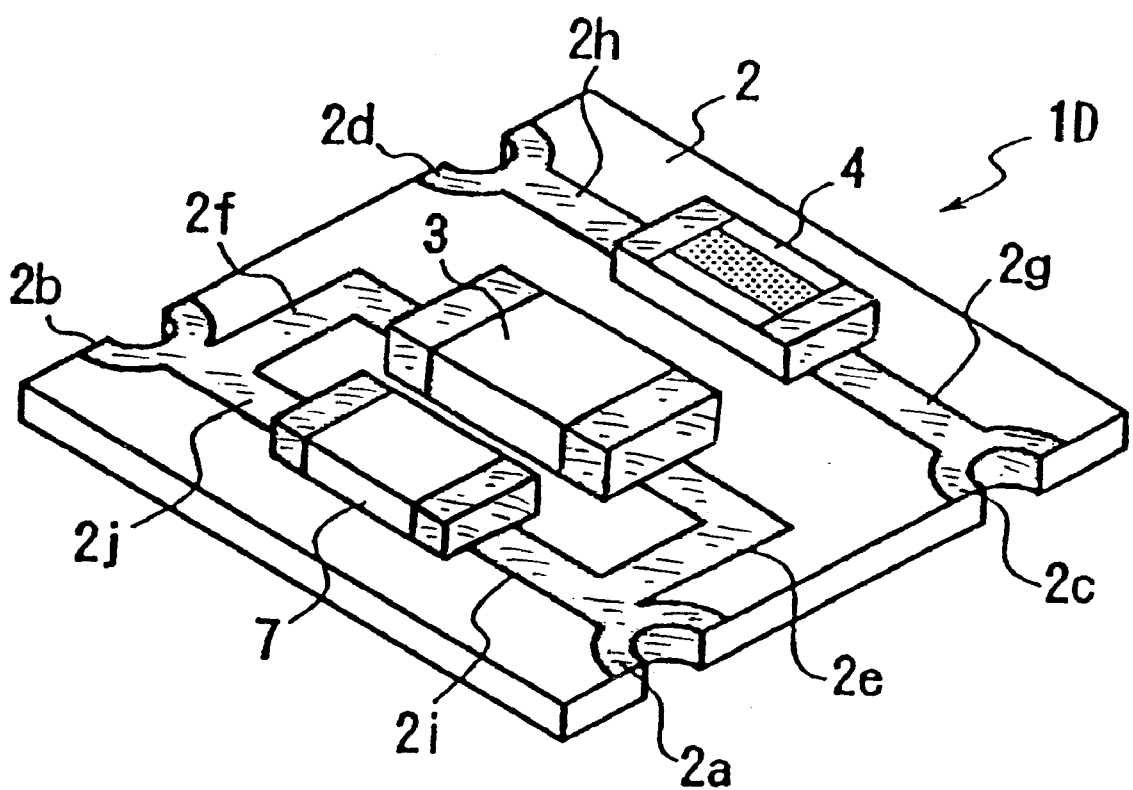
FIG. 7 is a perspective view of a fourth embodiment of the acceleration sensor module according to the present invention.

FIG. 7 shows a fourth embodiment of an acceleration sensor module 1D. In this embodiment, other printed wires 2i and 2j which have been branched from the printed wires 2e and 2f are formed on the printed wiring board 2 similar to that in FIG. 1, and a temperature-compensation capacitor 7 is connected between the printed wires 2i and 2j. In such a manner, the capacitor 7 is connected in parallel to the acceleration sensor 3 and is disposed in the vicinity of the acceleration sensor 3.

In this case, the capacitor 7 having appropriate capacity and temperature characteristics is beforehand connected in parallel to the acceleration sensor 3 and is disposed at a place reaching substantially the same temperature as that of the acceleration sensor 3. Even if the output voltage of the piezoelectric acceleration sensor 3 changes due to atmospheric temperature, since the capacitance value of the capacitor 7 also changes in accordance with the changes of the atmospheric temperature, an output voltage which is hardly influenced by atmospheric temperature can be obtained.

In the above embodiment, the example in which an acceleration sensor module has been arranged for a surface-mounted type is shown. However, the present invention is not be limited to this case, and the sensor module may be formed as a component with a lead terminal by disposing a lead terminal as an external connection terminal therein. In this case, the package of the module may be formed by dip-coating. Additionally, the modules 1A through 1D shown in FIG. 1, FIG. 3, FIG. 5, and FIG. 7 are just some exemplary embodiments. The embodiments can be combined or another device can be mounted on the printed circuit board 2. More specifically, if the trimmable resistor is a resistor film made by a printing method or the like, soldering can be omitted so as to achieve further miniaturization and cost reduction.

Moreover, it is natural that the circuit of the acceleration sensing device, in which the module of the present invention is applied, is not limited to those shown in FIG. 2, FIG. 4, and FIG. 6, and the module of the present invention is able to be applied in various kinds of acceleration sensing circuits.

As is clear from the description above, according to the present invention, an acceleration sensor and a trimmable resistor are mounted on a printed wiring board, in which at least one of the terminals of the acceleration sensor and at least one of the terminals of the trimmable resistor are individually connected to an external connection terminal on the printed circuit board via printed wiring, so that the sensitivity of the acceleration sensor can be adjusted by laser trimming of resistance values of the trimmable resistor so as to easily allow variations in the sensitivity to be held within a target range of tolerance. Since it is not necessary that additional components such as an amplifier be disposed on the printed circuit board on which the acceleration sensor and the trimmable resistor are mounted, miniaturization and, furthermore, significant cost reduction can be achieved.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An acceleration sensor module comprising a printed wiring board, and an acceleration sensor and a trimmable resistor, which are mounted on the printed wiring board; the acceleration sensor being the only active element on the printed wiring board in which at least one terminal of the acceleration sensor and at least one terminal of the trimmable resistor are respectively connected via printed wiring to at least one external connection terminal of the printed wiring board to be connected to an external circuit.

2. The acceleration sensor module according to claim 1, wherein the acceleration sensor is a piezoelectric acceleration sensor in which a piezoelectric ceramic element converts an acceleration into an electric signal.

3. The acceleration sensor module according to claim 2, further including a temperature compensation capacitor connected in parallel to the acceleration sensor.

4. The acceleration sensor module according to claim 3, wherein the temperature compensation capacitor is mounted on the printed wiring board adjacent to the acceleration sensor.

5. The acceleration sensor module according to claim 1, wherein the at least one terminal of the acceleration sensor and the at least one terminal of the trimmable resistor are connected to the same external connection terminal.

6. The acceleration sensor module according to claim 1, wherein the at least one terminal of the acceleration sensor and the at least one terminal of the trimmable resistor are connected to different external connection terminals.

7. An acceleration sensor module comprising a printed wiring board, and an acceleration sensor and a trimmable resistor, which are mounted on the printed wiring board, the acceleration sensor being the only active element on the printed wiring board in which a first terminal of the acceleration sensor is connected to a first connection terminal of the printed wiring board to be connected to an external circuit via a first printed wiring, and a first terminal of the trimmable resistor is connected to a second connection terminal of the printed wiring board to be connected to an external circuit via a second printed wiring.

8. An acceleration sensor according to claim 1, further including a second trimmable resistor mounted on the printed wiring board and connected to the at least one external connection terminal.

9. Acceleration sensing apparatus comprising a printed wiring board, and an acceleration sensor and a trimmable resistor, which are mounted on the printed wiring board; the acceleration sensor being the only active element on the printed wiring board in which at least one terminal of the acceleration sensor and at least one terminal of the trimmable resistor are respectively connected via printed wiring to at least one external connection terminal of the printed wiring board; and an amplifier connected to the at least one external connection terminal.

10. Acceleration sensing apparatus according to claim 9, wherein the acceleration sensor is a piezoelectric acceleration sensor in which a piezoelectric ceramic element converts an acceleration into an electric signal.

11. Acceleration sensing apparatus according to claim 10, further including a temperature compensation capacitor mounted on the printed wiring board and connected in parallel to the acceleration sensor.

12. Acceleration sensing apparatus according to claim 11, wherein the temperature compensation capacitor is mounted on the printed wiring board adjacent to the acceleration sensor.

13. Acceleration sensing apparatus according to claim 9, wherein the at least one terminal of the acceleration sensor and the at least one terminal of the trimmable resistor are connected to the same external connection terminal.

14. Acceleration sensing apparatus according to claim 9, wherein the at least one terminal of the acceleration sensor and the at least one terminal of the trimmable resistor are connected to different external connection terminals.

15. Acceleration sensing apparatus according to claim 9, further including a second trimmable resistor mounted on the printed wiring board and connected to the at least one external connection terminal.

16. Acceleration sensing apparatus comprising an acceleration sensor and a trimmable resistor, which are mounted on a printed wiring board, the acceleration sensor being the only active element on the printed wiring board in which a first terminal of the acceleration sensor is connected to a first connection terminal of the printed wiring board via a first printed wiring, and a first terminal of the trimmable resistor is connected to a second connection terminal of the printed wiring board via a second printed wiring; and an amplifier is connected to the first and second connection terminals.

17. Acceleration sensing apparatus according to claim 16, wherein the acceleration sensor is a piezoelectric acceleration sensor in which a piezoelectric ceramic element converts an acceleration into an electric signal.

18. Acceleration sensing apparatus according to claim 17, further including a temperature compensation capacitor mounted on the printed wiring board and connected in parallel to the acceleration sensor.

19. The acceleration sensor module according to claim 18, wherein the temperature compensation capacitor is mounted on the printed wiring board adjacent to the acceleration sensor.

20. Acceleration sensing apparatus according to claim 16, further including a second trimmable resistor mounted on the printed wiring board and connected to the at least one external connection terminal.

\* \* \* \* \*